United States Patent [19]

Jung

[11] Patent Number: 5,856,238

[45] Date of Patent: Jan. 5, 1999

[54] METHOD FOR FABRICATING METAL WIRE OF SEMICONDUCTOR DEVICE

[75] Inventor: Jin Ki Jung, Kyoungki-do, Rep. of Korea

[73] Assignee: Hyundai Electronics Industries Co., Ltd., Kyoungki-do, Rep. of Korea

[21] Appl. No.: 867,456

[22] Filed: Jun. 2, 1997

[30] Foreign Application Priority Data

Jun. 27, 1996 [KR] Rep. of Korea .................. 1996 24264

[51] Int. Cl.$^6$ .................................................. H01L 21/44
[52] U.S. Cl. ........................................... 438/688; 438/685
[58] Field of Search ........................... 438/643, 653, 438/669, 688, 720, 742, 751, 685

[56] References Cited

U.S. PATENT DOCUMENTS

| | | | |
|---|---|---|---|
| 5,430,328 | 7/1995 | Hsue | 257/750 |
| 5,506,177 | 4/1996 | Kishimoto et al. | 437/195 |
| 5,534,463 | 7/1996 | Lee et al. | 437/195 |
| 5,554,254 | 9/1996 | Huang et al. | 156/625.1 |
| 5,554,563 | 9/1996 | Chu et al. | 437/140 |

*Primary Examiner*—Charles L. Bowers, Jr.
*Assistant Examiner*—Renee R. Berry
*Attorney, Agent, or Firm*—Gary M. Nath; Nath & Associates

[57] ABSTRACT

A method for fabricating a metal wire of semiconductor devices is provided and comprises the steps of: depositing a barrier metal layer on an insulating film and subjecting the barrier metal layer to $SF_6$ plasma treatment; forming an aluminum metal layer, a reflection-preventive layer and a photoresist film pattern on the surface of the barrier metal layer, in order; etching the reflection-preventive layer, the aluminum metal layer and the barrier metal layer to form a metal wire, with the photoresist film pattern serving as an etch mask; and removing the photoresist film pattern. The $SF_6$ plasma treatment leaves no residue on the insulating film 2 during etching, as silicon nodule grows a little on the barrier metal layer when the aluminum metal layer is deposited thereon.

5 Claims, 2 Drawing Sheets

METHOD FOR FABRICATING METAL WIRE OF SEMICONDUCTOR DEVICE

BACKGROUND OF THE INVENTION

1. Field of the Invention

The present invention relates, in general, to a method for fabricating a metal wire of semiconductor devices and, in particularly, to the use of $SF_6$ plasma treatment in fabricating a metal wire of semiconductor devices, thereby leaving no residue of the conductive material on an insulating layer.

2. Description of the Prior Art

With large resistance, the polysilicon layer used for semiconductor devices is a cause for the decrease in the operational speed of semiconductor devices. As a conductive passage, a metal wire is employed to reduce the resistance.

In order to better understand the background of the invention, a description will be given of a conventional process for fabricating a metal wire of semiconductor devices in conjunction with FIGS. 1 and 2.

In FIGS. 1 and 2, conventional process steps for fabricating a metal wire of a semiconductor device are shown, leaving residue.

To fabricate a metal wire, a substrate 1 is first covered with an insulating film 2 on which a barrier metal layer 3, an aluminum metal layer 5 and a reflection-preventive film 6 are, in sequence, deposited, as shown in FIG. 1. Thereafter, a photoresist pattern 7 is formed on the reflection-preventive film 6.

Usually, the barrier metal layer 3 is made from, for example, titanium or titanium nitride film, the aluminum metal layer 5 from, for example, Ai—Si—Cu, and the reflection-preventive film 6 from, for example, titanium nitride film.

With the photoresist film pattern 7 serving as a mask, the reflection-preventive film 6, the aluminum metal layer 5 and the barrier metal layer 3 are, in order, etched to form a metal wire 8, which is followed by the removal of the photoresist film pattern 7, as shown in FIG. 2. At the moment, the barrier metal layer 3 leaves residues 3' on the surface of the insulating film 2. They cause a bridge between neighboring metal wires 8, forming a short circuit.

When the aluminum metal layer of Al—Si—Cu is deposited on the surface of the barrier metal layer 3, a silicon nodule 4 grows on the barrier metal layer 3 and remains after the etching of the aluminum metal layer 5. When the underlying barrier metal layer 3 is etched off, the silicon nodule is removed together, but a part of the titanium nitride remains.

SUMMARY OF THE INVENTION

Therefore, it is an objective of the present invention to overcome the above problems encountered in prior arts and to provide a method for fabricating a metal wire of semiconductor devices, which prevents the formation of residue by reducing the growth of the silicon nodule upon the deposition of the aluminum metal layer through $SF_6$ plasma treatment on the barrier metal layer.

In accordance with the present invention, the above objective could be accomplished by a provision of a method for fabricating a metal wire of semiconductor devices, comprising the steps of: depositing a barrier metal layer on an insulating film and subjecting the barrier metal layer to $SF_6$ plasma treatment; forming an aluminum metal layer, a reflection-preventive layer and a photoresist film pattern on the surface of the barrier metal layer, in order; etching the reflection-preventive layer, the aluminum metal layer and the barrier metal layer to form a metal wire, with the photoresist film pattern serving as an etch mask; and removing the photoresist film pattern.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

Figure 1:
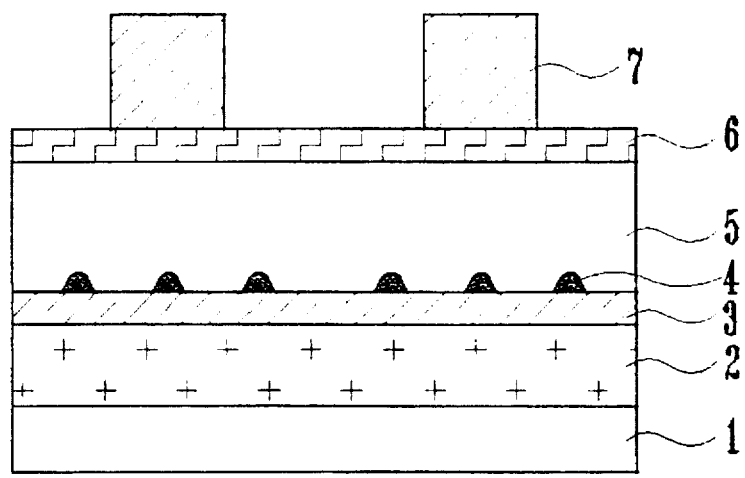
FIGS. 1 and 2 are schematic cross sectional views showing a conventional method for fabricating a metal wire consisting of a barrier metal layer, an aluminum metal layer and a reflection-preventive layer.
Figure 2:
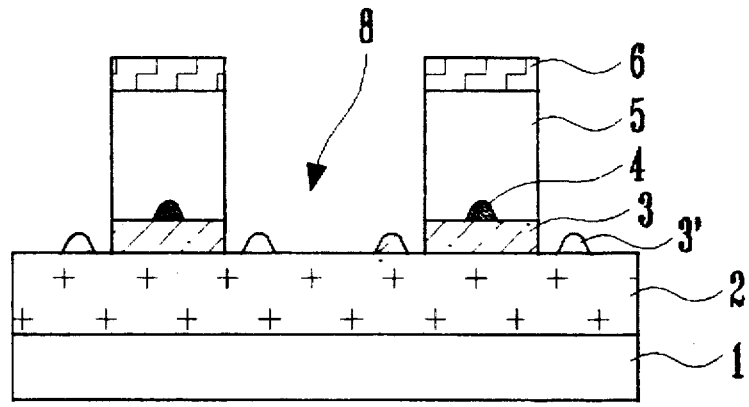

The application of the preferred embodiment of the present invention is best understood with reference to the accompanying drawings, wherein like reference numerals are used for like and corresponding parts, respectively.

FIGS. 3 through 6 show process steps for fabricating a metal wire of semiconductor devices, according to the present invention.

Figure 3:
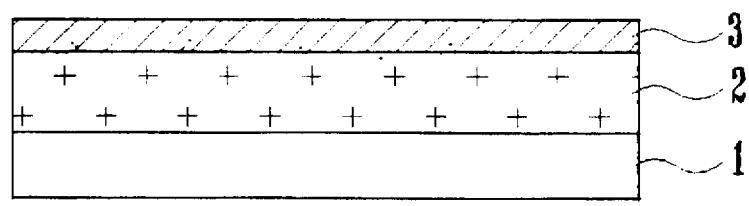
FIGS. 3 through 6 are schematic cross sectional views showing a method for fabricating a metal wire consisting of a barrier metal layer, an aluminum metal layer and a reflection-preventive layer, in accordance with the present invention.

First, as shown in FIG. 3, a substrate 1 is covered with an insulating film 2, for example, an oxide film, which is, then, overlaid with a barrier metal layer 3, for example, a titanium or titanium nitride film.

Figure 4:
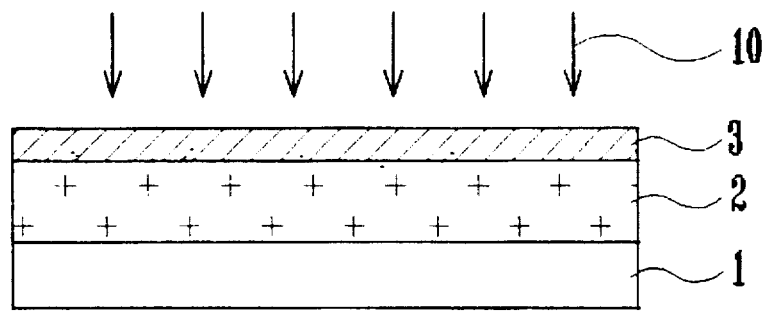

FIG. 4 is a cross section view taken after the barrier metal layer 3 is treated with $SF_6$ plasma 10. For the $SF_6$ plasma treatment, 20–100 SCCM of $SF_6$ is used at a source power of 500–2,000 W and at a bias power of 0–100 W under a pressure of 2.0–20.0 mTorr.

Figure 5:
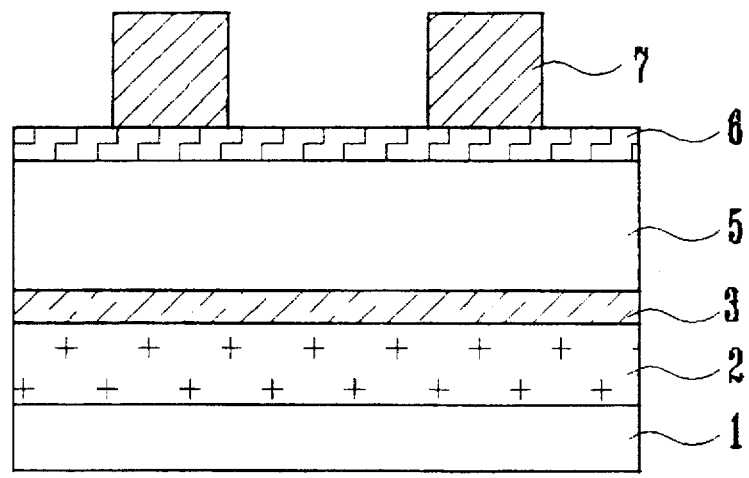

FIG. 5 is a cross section view taken after an aluminum metal layer 5 and a reflection-preventive layer 6 is sequentially deposited, followed by the formation of a photoresist pattern 7. Al—Si—Cu is used for the aluminum metal layer 5 and a titanium nitride film for the reflection-preventive film 6.

Figure 6:
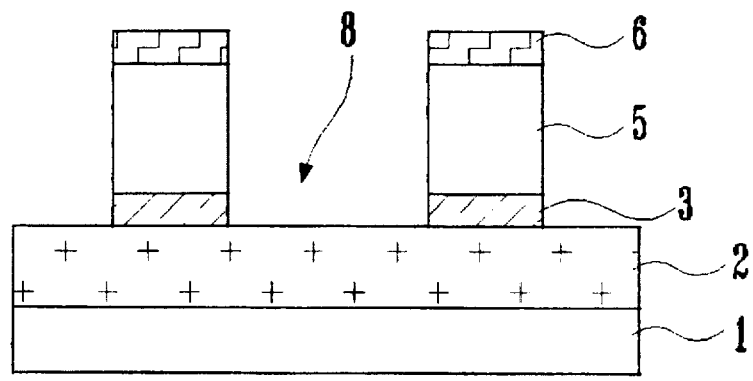

Next, using the photoresist film pattern 7 as a mask, the reflection-preventive film 6, the aluminum metal layer 5 and the barrier metal layer 3 are, in sequence, etched to form a metal wire 8, which is followed by the removal of the photoresist pattern 7, as shown in FIG. 6.

As described hereinbefore a characteristic of the present invention is that, following the deposition of the barrier metal layer of titanium or titanium nitride layer, the $SF_6$ plasma treatment is carried out. This treatment leaves no residue on the insulating film 2 during etching, as silicon nodule a grows a little on the barrier metal layer when an aluminum metal layer of As—Si—Cu is deposited thereon.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A method for fabricating a metal wire of semiconductor devices, comprising the steps of:
   depositing a barrier metal layer on an insulating film and subjecting the barrier metal layer to $SF_6$ plasma treatment, said $SF_6$ plasma treatment carried out at a pressure of 2.0–20.0 m Torr;
   forming an aluminum metal layer, a reflection-preventive layer and a photoresist film pattern on the surface of the barrier metal layer, in order;
   etching the reflection-preventive layer, the aluminum metal layer and the barrier metal layer to form a metal wire, with the photoresist film pattern serving as an etch mask; and removing the photoresist film pattern.

2. A method in accordance with claim 1, wherein said barrier metal layer is formed of titanium or titanium nitride.

3. A method in accordance with claim 1, wherein said aluminum metal layer is formed of Al—Si—Cu alloy.

4. A method in accordance with claim 1, wherein said $SF_6$ plasma treatment is carried out using $SF_6$ at a rate of 20–100 SCCM.

5. A method in accordance with claim 1, wherein said $SF_6$ plasma treatment is carried out at a source power of 500–2000 W and at a bias power of 0–100 W.

* * * * *